United States Patent
Satoh et al.

(10) Patent No.: US 7,423,857 B2
(45) Date of Patent: Sep. 9, 2008

(54) CURRENT DETECTING CIRCUIT AND ACTUATOR DRIVING APPARATUS

(75) Inventors: Kiyokatsu Satoh, Saitama (JP); Yasuo Kurosu, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/495,015

(22) PCT Filed: Dec. 3, 2002

(86) PCT No.: PCT/JP02/12667

§ 371 (c)(1),
(2), (4) Date: May 10, 2004

(87) PCT Pub. No.: WO03/048790

PCT Pub. Date: Jun. 12, 2003

(65) Prior Publication Data

US 2005/0002143 A1    Jan. 6, 2005

(30) Foreign Application Priority Data

Dec. 3, 2001   (JP)   ............................. 2001-368125

(51) Int. Cl.
| | |
|---|---|
| *H02H 3/08* | (2006.01) |
| *H02H 9/02* | (2006.01) |
| *H01H 47/00* | (2006.01) |
| *H01H 9/00* | (2006.01) |
| *H01H 47/32* | (2006.01) |
| *H01H 51/30* | (2006.01) |

(52) U.S. Cl. ...................... 361/93.1; 361/152; 361/154
(58) Field of Classification Search ................ 361/93.1, 361/152, 154
See application file for complete search history.

(56) References Cited

U.S. PATENT DOCUMENTS

| | | | | |
|---|---|---|---|---|
| 4,078,215 | A | * | 3/1978 | Vinson ....................... 333/174 |
| 5,933,313 | A | * | 8/1999 | Furukawa .................... 361/154 |
| 5,936,563 | A | * | 8/1999 | Nakamura ................... 341/144 |
| 6,336,448 | B1 | * | 1/2002 | Furuhata et al. ............. 123/644 |
| 6,892,443 | B2 | * | 5/2005 | Szwarc et al. ............... 29/610.1 |

FOREIGN PATENT DOCUMENTS

| | | |
|---|---|---|
| JP | 02-045768 | 2/1990 |
| JP | 2-128964 | 10/1990 |
| JP | 08-240277 | 9/1996 |
| JP | 09-130004 | 5/1997 |

\* cited by examiner

*Primary Examiner*—Michael J Sherry
*Assistant Examiner*—Dharti H Patel
(74) *Attorney, Agent, or Firm*—Howard & Howard Attorneys, P.C.

(57) ABSTRACT

By switching the NMOS (11) on and off, a drive current passes through a solenoid (15). The drive current passes through a conversion circuit (16), and an amplifier circuit (17) outputs a current detection result by amplifying the output voltage of the conversion circuit (16). Because a plurality of resistor elements ($16_1$ to $16n$) that constitute the conversion circuit (16), together with elements that constitute the amplifier circuit (17) are formed diffused to a semiconductor substrate (100), even if the attribute changes by the conversion circuit (16) generating heat, by the drive current, the amplifier circuit (17) becomes approximately the same temperature, and the attribute changes. Therefore, a highly accurate current detection becomes possible without using components for temperature correction.

7 Claims, 9 Drawing Sheets

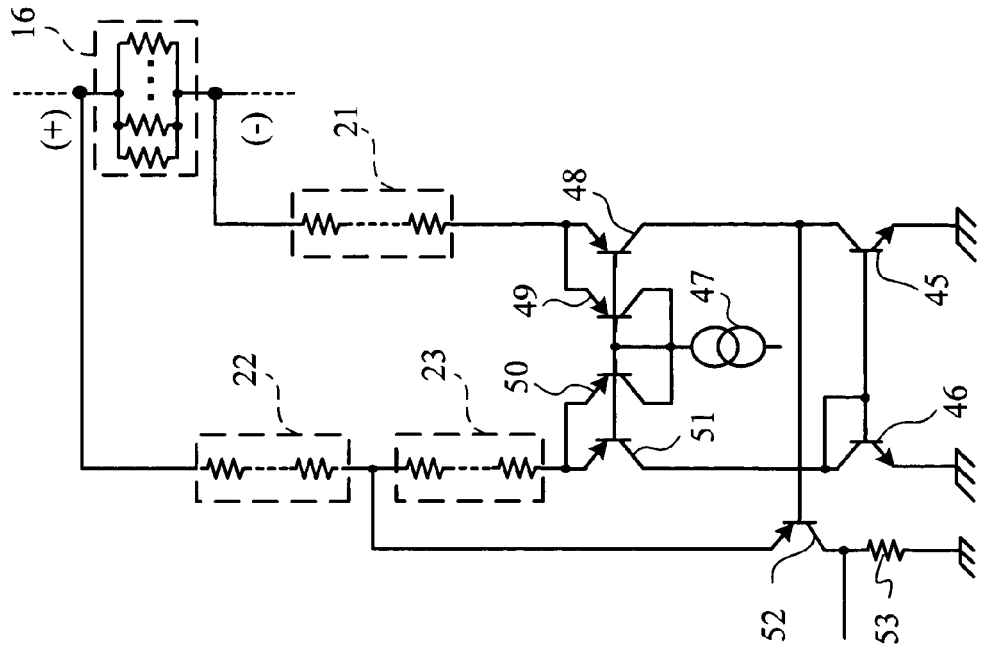
FIG.2B AMPLIFIER CIRCUIT AB
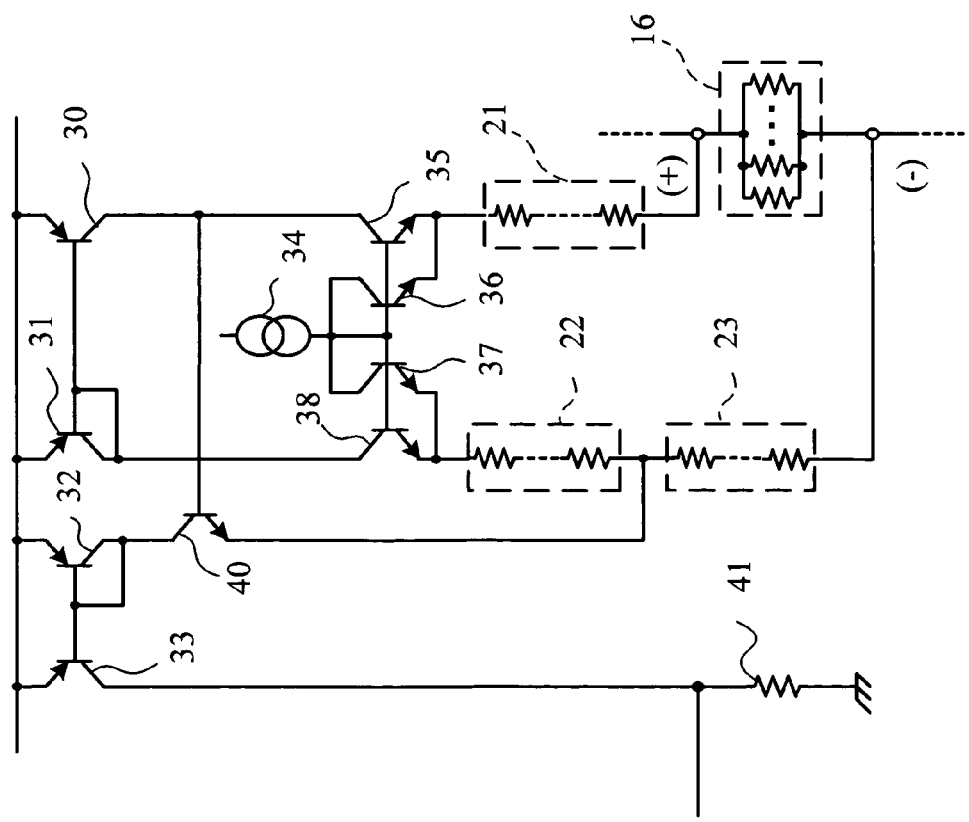
FIG.2A AMPLIFIER CIRCUIT AA

FIG.4A CONTROL SIGNAL SC
FIG.4B DRIVE CURRENT OF SOLENOID
FIG.4C OUTPUT VOLTAGE OF AMPLIFOIER CIRCUIT 17
FIG.4D OUTPUT VOLTAGE OF SMOOTHING CIRCUIT 18

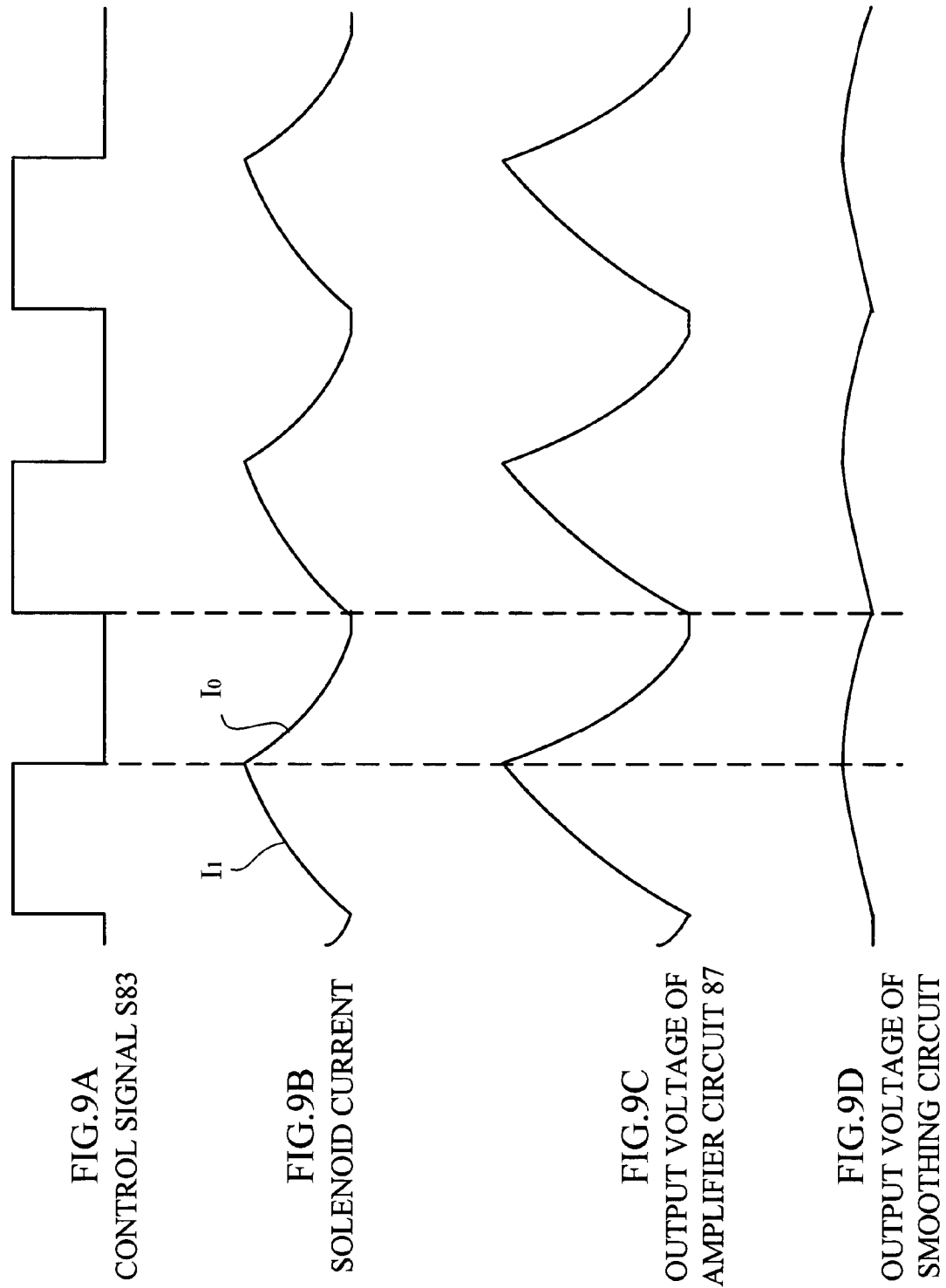

CURRENT DETECTING CIRCUIT AND ACTUATOR DRIVING APPARATUS

TECHNICAL FIELD

The present invention relates to a current detection circuit and an actuator drive unit.

BACKGROUND ART

Recent automobiles, etc., load electronic components for control, and carry out high-speed electronic control with a high accuracy.

For example, automatic vehicles carry out electronic control applying hydraulic pressure, to realize automatic transmission.

Automatic vehicles load a solenoid for electronically controlling hydraulic pressure, and a solenoid drive unit for passing a current through the solenoid.

Art concerning the solenoid drive unit is recited in for example, FIG. 2 of Unexamined Japanese Patent Application KOKAI Publication No. H8-240277. The content of this publication is incorporated herein.

FIG. 8 is a diagram showing an outline structure of a conventional solenoid drive unit shown in FIG. 2 of the aforementioned publication.

A solenoid drive unit 80 is constituted by an N-channel type MOS transistor (hereinafter referred to as NMOS) 81, a battery 82, a control circuit 83, a diode 84, a solenoid 85, a resistance 86, an amplifier 87, a resistance 88, and a capacitor 89. The solenoid drive unit 80 passes a current to a coil of the solenoid 85, and drives the solenoid 85, by exciting the current.

A drain of the NMOS 81 is connected to a positive electrode of the battery 82. A gate of the NMOS 81 is connected to the control circuit 83. A source of the NMOS 81 is connected to a cathode of the diode 84 and one end 85a of the solenoid 85.

A negative electrode of the battery 82 is connected to a ground. The control circuit 83 provides a control signal S83 to the gate of the NMOS 81. An anode of the diode 84 is connected to the ground. Another end 85b of the solenoid 85 is connected to one end of the resistance 86.

The other end of the resistance 86 is connected to the ground. The resistance 86 is a conversion circuit that converts a current that passes through the solenoid 85 to a corresponding voltage. Both ends of the resistance 86 are connected to a positive input terminal (+) and a negative input terminal (−) of the amplifier 87.

An output terminal of the amplifier 87 is connected to one end of the resistance 88. The other end of the resistance 88 is connected to one electrode of the capacitor 89. The other electrode of the capacitor 89 is connected to the ground.

FIGS. 9A to D are wave form diagrams for describing the operation of the solenoid drive unit 80 in FIG. 8. Operation of the solenoid drive unit 80 will be described with reference to FIG. 9.

In the solenoid drive unit 80, as shown in FIG. 9A, the control circuit 83 provides a control signal S83 that repeats a high level (hereinafter referred to as "H") and a low level (hereinafter referred to as "L") to the gate of the NMOS 81.

When the control signal S83 is "H", the NMOS 81 is turned on, and connects one end 85a of the solenoid to the positive electrode of the battery 82. By this, a power source current $I_1$ passes through the negative electrode of the battery 82 via the positive electrode of the battery 82, the resistance 86, and the ground.

When the control signal S83 changes to "L", the NMOS 81 is turned off. When the NMOS is turned off, a counter electromotive force occurs at the solenoid 85. By this counter electromotive force, a regenerative current $I_0$ passes through the anode of the diode 84, the cathode of the diode 84, the solenoid 85, the resistance 86 and a loop of the ground, from the ground.

By the current $I_1$ and the regenerative current $I_0$ passing, a voltage proportional to the current that passes through the solenoid 85, is generated at both ends of the resistance 86.

The amplifier 87 amplifies the difference of voltage of the voltage input to the negative input terminal and the voltage input to the positive input terminal, and outputs a voltage signal 87 that pulsates, as shown in FIG. 9C.

The smoothing circuit that is constituted by the resistance 88 and the capacitor 89, smoothes and outputs, as shown in FIG. 9D, the voltage signal S87 that the amplifier 87 outputs. The smoothed voltage signal S87 output from the smoothing circuit is for example, fed back to the control circuit 83.

The control circuit 83 changes the duty ratio of the control signal S83, based on the smoothed voltage signal fed back from the smoothing circuit. Namely, the control circuit 83 carries out PWM (Pulse Width Modulation) control. By this, the current that passes through the solenoid 85 is optimized.

The output of the smoothing circuit is for example, A/D converted, and provided to a processor for vehicle control, which is not shown in the drawings.

The conventional solenoid drive unit 80 has the problems of below. The NMOS 81, witch is a switching element, and the resistance 86, which is a conversion circuit, both generate heat, because a current for driving solenoid 85 passes through. Therefore, the NMOS 81 and the resistance 86 are embedded in an Electronic Control Unit (ECU) as different components. However, by separating the two components, the temperature in the ECU becomes uneven, and because temperature of each component varies, it is difficult to detect a current (a current that passes through the solenoid 85) accurately.

To accurately detect a current, a component for temperature correction, which is not shown in the drawings, is placed in the ECU. Therefore, the number of components increases, and low-cost of the ECU is difficult. Because the solenoid drive unit is constituted by a plurality of components, miniaturization of the ECU is also difficult.

The same problems exist not only in the solenoid drive unit, but also in other drive units of actuators, such as a motor, etc.

DISCLOSURE OF INVENTION

The present invention has been made in consideration of the above, and an object of the present invention is to provide a current detection circuit and/or an actuator drive unit, which makes a highly accurate current detection possible, without needing components for temperature correction.

Another object of the present invention is to provide a current detection circuit and/or an actuator drive unit that has few components.

Still another object of the present invention is to provide a highly reliable temperature detection circuit and/or a solenoid drive unit.

To achieve the above objects, a current detection circuit according to a first aspect of the present invention comprises: a conversion circuit (16), which generates, when a current, that is a detection target, passes there through, an electronic signal corresponding to the current that passes; and an amplifier circuit (17), which amplifies the electronic signal generated by the conversion circuit (16), wherein the conversion circuit (16) and the amplifier circuit (17) are formed on a common substrate (100).

The current detection circuit may further comprise a switching element (11) that connects a power source (12) and an actuator (15), which is a drive target, on an off, wherein: the conversion circuit (16) may be constituted by a circuit that generates an electronic signal that corresponds to a current that passes through the actuator (15) by the connection therewith being switched on and off, by the switching on and off of the switching element (11); the amplifier circuit (17) may amplify the electronic signal that corresponds to the current that passes through the actuator (15), which the conversion circuit (16) outputs, and the switching element (11), the conversion circuit (16), and the amplifier circuit (17) may be formed on a common substrate (100).

The conversion circuit (16) may be constituted by a plurality of conversion elements ($16_1$ to $16n$) that convert the current that passes through the actuator (15) to a voltage, and may generate the electronic signal.

The plurality of conversion elements ($16_1$ to $16n$) that constitute the conversion circuit (16) may be formed diffused to the substrate (100).

The plurality of conversion elements ($16_1$ to $16n$) may be constituted by resistive elements.

The amplifier circuit (17) may comprise a plurality of gain setting circuits (21 to 23) that set the gain of the amplifier circuit (17).

The plurality of gain setting circuits (21 to 23) may be formed diffused to the substrate (100).

Each of the plurality of gain setting circuits (21 to 23) may be constituted by a plurality of resistive elements.

The conversion circuit (16) may be constituted by a plurality of conversion elements ($16_1$ to $16n$) that convert the current that passes through the actuator (15) to a voltage, and may generate the electronic signal; the amplifier circuit (17) may comprise a plurality of gain setting circuits (21 to 23) that set the gain of the amplifier circuit (17), and the plurality of gain setting circuits (21 to 23) may be formed close to the conversion elements ($16_1$ to $16n$) of the substrate (100).

Each of the plurality of gain setting circuits (21 to 23) may be constituted by a plurality of elements, and the plurality of elements and the plurality of conversion elements that constitute the plurality of gain setting circuits (21 to 23) may be formed diffused to the substrate (100).

The plurality of conversion elements ($16_1$ to $16n$) and the plurality of gain setting circuits (21 to 23) may be placed at a thermally close position.

The plurality of gain setting circuits (21 to 23) may be constituted by resistive circuits.

The substrate (100) may be formed by a semiconductor substrate.

The amplifier circuit (17) may comprise gain setting circuits (21 to 23), the gain changing in accordance with the attribute of the gain setting circuits (21 to 23), and each of the conversion circuit (16) and the gain setting circuits (21 to 23) may be constituted by a plurality of elements, wherein the plurality of elements that constitute the conversion circuit (16) and the plurality of elements that constitute the gain setting circuits (21 to 23) are placed close to each other.

The amplifier circuit (17) may comprise gain setting circuits (21 to 23), the gain changing in accordance with the attribute of the gain setting circuits (21 to 23), and each of the conversion circuit (16) and the gain setting circuits (21 to 23) may be constituted by a plurality of elements, wherein at least one part of elements that constitute the gain setting circuits (21 to 23) is arranged in between the elements that constitute the conversion circuit (16).

The conversion circuit (16) may generate heat by the current passing through; the amplifier circuit (17) may comprise gain setting circuits (21 to 23), the gain changing in accordance with the attribute of the gain setting circuits (21 to 23), and each of the conversion circuit (16) and the gain setting circuits (21 to 23) may be constituted by a plurality of elements, and may be placed so that the elements that constitute the conversion circuit (16) and the elements that constitute the gain setting circuits (21 to 23) are heated by the heat from the conversion circuit (16).

The plurality of elements that constitute the conversion circuit (16) and the gain setting circuits (21 to 23) may be placed so that the temperature of the elements that constitute gain setting circuits (21 to 23) rises in accordance with the rise of temperature of the elements that structure the conversion circuit (16), and the temperature of elements that constitute gain setting circuits falls, in accordance with the fall of temperature of the elements that structure the conversion circuit (16).

Each of the conversion circuit (16) and the plurality of gain setting circuits (21 to 23) may be constituted by a plurality of resistive elements.

To achieve the above objects, an actuator drive unit according to a second aspect of the present invention comprises the current detection circuit according to the first aspect, which further includes a switching element (11) that connects a power source (12) and an actuator (15), which is a drive target, on an off, in response to a control signal, and a control circuit (13), which provides the control signal to the switching element (11) in accordance with the output of the amplifier circuit (17), wherein: the conversion circuit (16) generates an electronic signal that corresponds to a current that passes through the actuator (15) by the connection therewith being switched on and off, by the switching on and off of the switching element (11), and the amplifier circuit (17) amplifies the electronic signal that corresponds to the current that passes through the actuator (15), which the conversion circuit (16) outputs.

BRIEF DESCRIPTION OF DRAWINGS

FIG. 2A is a diagram showing an example of a structure of an amplifier circuit AA in FIG. 1.

FIG. 2B is a diagram showing an example of a structure of an amplifier circuit AB in FIG. 1.

FIGS. 9A-9D are wave form diagrams for describing the operation of the solenoid drive unit in FIG. 8.

BEST MODE FOR CARRYING OUT THE INVENTION

Figure 1:
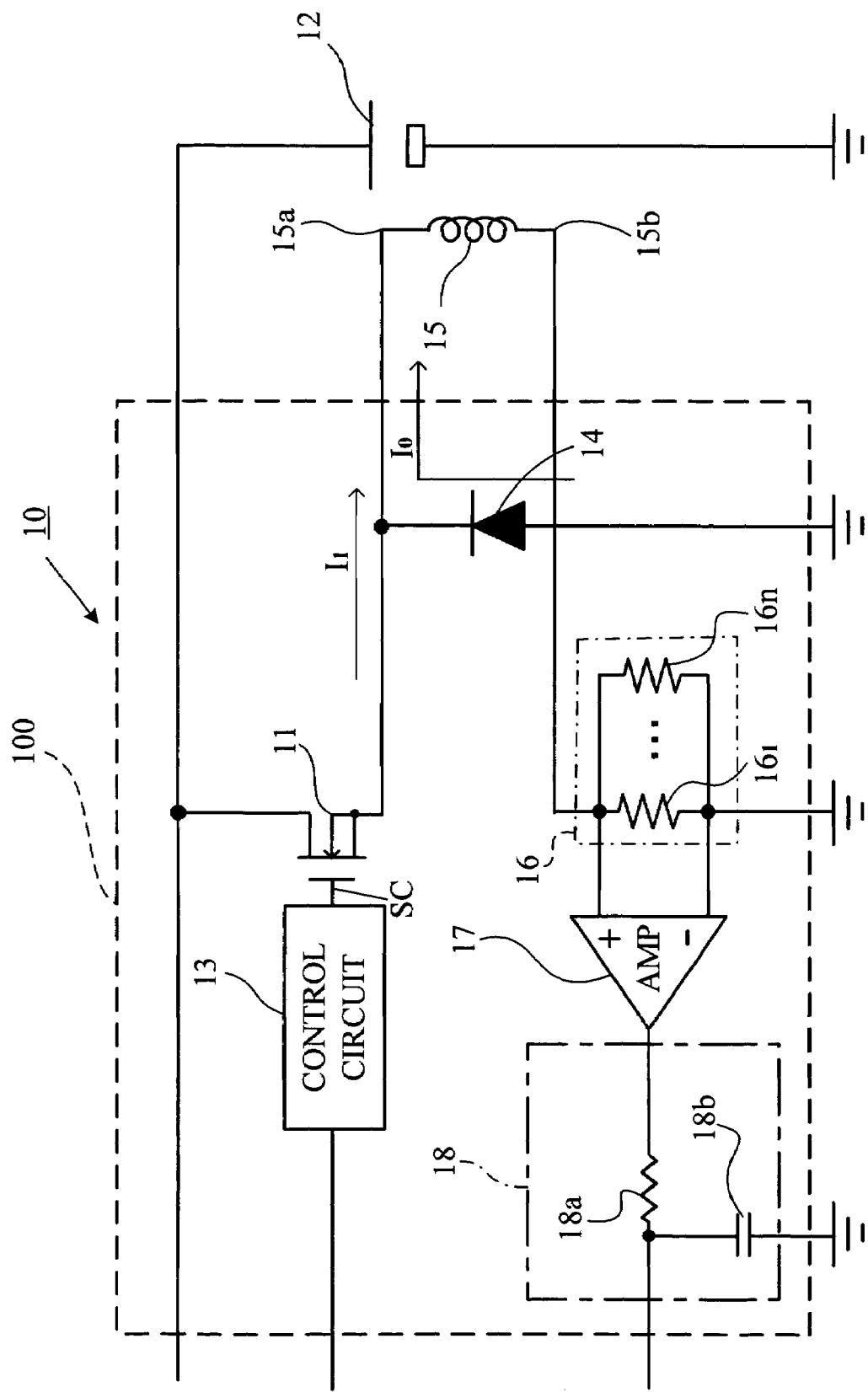
FIG. 1 is a diagram showing an example of a structure of a solenoid drive unit according to an embodiment of the present invention.

As shown in FIG. 1, a solenoid drive unit 10 according to an embodiment of the present invention is constituted by an N-channel MOS transistor (hereinafter referred to as NMOS) 11, a power source 12, a control circuit 13, a diode 14, a solenoid 15, a conversion circuit 16, an amplifier circuit 17, and a smoothing circuit 18.

The NMOS 11, the control circuit 13, the diode 14, the conversion circuit 16, the amplifier circuit 17, and the smoothing circuit 18 are formed on a common semiconductor substrate 100.

The NMOS 11 functions as a current switch, and the drain thereof is connected to the positive electrode of the power source 12. The gate of the NMOS 11 is connected to the control circuit 13. The source of the NMOS 11 is connected to a cathode of the diode 14 and one end 15a of a coil of the solenoid 15. When the NMOS 11 is turned on, a power source current 11 from the power source 12 is passed through the coil of the solenoid 15.

The negative electrode of the battery 12 is connected to a ground.

The control circuit 13 provides a control signal SC to the gate of the NMOS 11, and turns on/off the NMOS 11.

The anode of the diode 14 is connected to the ground. The cathode of the diode 14 is connected to a connection point of the source of the NMOS 11 and one end 15a of the coil of the solenoid 15. The diode 14 passes through from the ground to the one end 15a of the solenoid 15, a regenerative current $I_0$, which occurs by counter electromotive force generated in the coil of the solenoid 15 when the NMOS 11 is turned off.

The conversion circuit 16 is constituted by a plurality of resistor elements $16_1$ to $16n$ that are connected in parallel, in between another end 15b of the coil of the solenoid 15, and the ground. The conversion circuit 16 converts to a voltage corresponding to a current passing thought the solenoid 15. By applying the common art of semiconductor resistor element manufacturing, the converter 16 can produce physically one resistor element having an equal capacity (value of resistance, current capacity, etc.). However, the conversion circuit 16 is constituted by a parallel circuit of a plurality of resistor elements.

FIGS. 2A and B are drawings showing an example of a structure of the amplifier circuit 17.

As the amplifier circuit 17, an amplifier circuit AA shown in FIG. 2A, an amplifier circuit AB shown in FIG. 2B, or an amplifier circuit that has combined the amplifier circuit AA and the amplifier circuit AB is used. A resistive circuit 21 that is constituted by a plurality of resistor elements that are serially connected, a resistive circuit 22 that is constituted by a plurality of resistor elements that are serially connected, and a resistive circuit 23 that is constituted by a plurality of resistor elements that are serially connected, are provided on the amplifier circuit AA, amplifier circuit AB, or the amplifier circuit that has combined the amplifier circuit AA and the amplifier circuit AB. The resistive circuits 21 to 23 are for adjusting the gain (amplification factor) of the amplifier circuit 17. By applying the common art of semiconductor resistor element manufacturing, physically one resistive element that has an equal capacity (value of resistance, capacity of current, etc.) as the plurality of resistive elements can be manufactured. However, the conversion circuit 16 is constituted by a combination of a plurality of resistor elements.

In the amplifier circuit AA, one end of the resistive circuit 21 is connected to a positive input terminal (+). One end of the resistive circuit 22 is connected to one end of the resistive circuit 23, and the other end of the resistive circuit 23 is connected to a negative input terminal (−) of the resistive circuit 23. Four PNP-type transistors 30, 31, 32, and 33 wherein an emitter is commonly connected to the power source, and a current source 34, are set in the amplifier circuit AA.

The base of the transistor 30 is connected to the base and the collector of the transistor 31. The collector of the transistor 30 is connected to the collector of an NPN-type transistor 35, and the emitter of the transistor 35 is connected to another end of the resistive circuit 21.

The current source 34 is connected to a base of the transistor 35, a collector and a base of the NPN-type transistor 36, a collector and a base of the NPN-type transistor 37, and a base of the NPN-type transistor 38. An emitter of the transistor 36 is connected to another end of the resistive circuit 21. An emitter of the transistors 37 and 38 are connected to another end of the resistive circuit 22. A collector of the transistor 31 is connected to a collector of the transistor 38.

Bases of the transistors 32 and 33 are connected to a collector of the transistor 32. A collector of the transistor 32 is connected to a collector of a PNP-type transistor 40 wherein a base thereof is connected to a collector of the transistor 30. An emitter of the transistor 40 is connected at a connection point of the resistive circuit 22 and the resistive circuit 23.

A collector of the transistor 33 is connected to one end of a resistance 41. The other end of the resistance 41 is grounded.

In this kind of amplifier circuit AA, when the regenerative current $I_0$ is passing through the conversion circuit 16, the transistors 30, 31, 35 to 38, and the current source 34 become a constant current source circuit, and passes a current through to the transistor 40, so that the current that passes through the resistive circuit 21, and the current that passes through the resistive circuit 22 are equal. The current that goes through the transistor 40 corresponds to the regenerative circuit $I_0$. The transistor 33 passes through a current that is proportional to the current that passes through the transistor 40, to the resistance 41. The resistance 41 generates a voltage corresponding to the regenerative circuit $I_0$, as a current detection signal.

On the other hand, the amplifier circuit AB comprises two NPN-type transistors 45 and 46 that each have emitters grounded, and a current source 47. A base of the transistor 45 is connected to a base and collector of the transistor 46. A collector of the transistor 45 is connected to a collector of the PNP-type transistor 48. An emitter of the transistor 48 is connected to one end of the resistive circuit 21.

The current source 47 is connected to a base of the transistor 48, and at the same time to a collector and a base of the PNP-type transistor 49, a collector and a base of the PNP-type transistor 50, and a base of the PNP-type transistor 51. An emitter of the transistor 49 is connected to an emitter of the transistor 48.

A collector of the transistor 51 is connected to a collector of the transistor 46. An emitter of the transistor 51 and an emitter of the transistor 50 are connected to one end of the resistive circuit 23. The other end of the resistive circuit 23 is connected to one end of the resistive circuit 22, and the other end of the resistive circuit 22 is connected to a positive input terminal (+). The other end of the resistive circuit 21 is connected to a negative input terminal (−).

At a connection point of the resistive circuit 23 and the resistive circuit 22, an emitter of the PNP-type transistor 52 is connected. A base of the transistor 52 is connected to a collector of the transistor 48, and a collector of the transistor 52 is connected to one end of a resistance 53. The other end of the resistance 53 is grounded.

In this kind of amplifier circuit AB, when the regenerative current $I_1$ is passing through the conversion circuit 16, by the NMOS 11 being switched on, the transistors 45, 46, and 48 to 51 and the current source 47 become a constant current source circuit, and passes a current through to the transistor 52, so that the current that passes through the resistive circuit 21, and the current that passes through the resistive circuit 23 are equal. The current that goes through the transistor 52 corresponds to the regenerative circuit $I_1$. The resistance 53 generates a voltage corresponding to the regenerative circuit $I_1$, as a current detection signal.

The smoothing circuit 18 is constituted by a resistance 18a wherein one end is connected to an output terminal of the amplifier circuit 17, and a capacitor 18b which is connected in between another end of a resistance 17a and a ground. The connection point of the resistance 18a and the capacitor 18b forms the output terminal of the smoothing circuit 17, and smoothes the output signal of the amplifier circuit 17.

Figure 3:
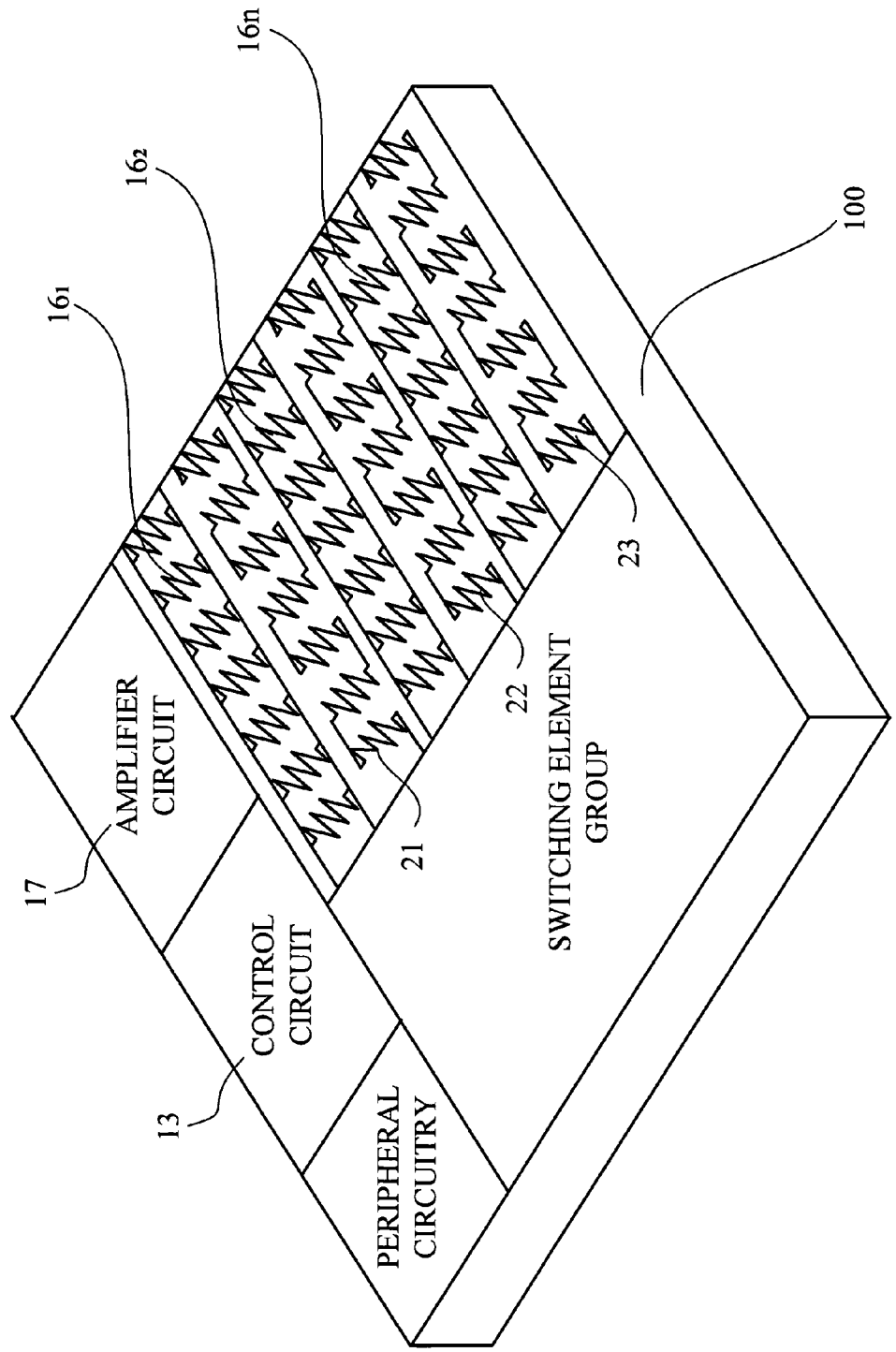
FIG. 3 is an explanatory diagram showing a layout example of the solenoid drive unit.

FIG. 3 is a diagram for describing an example of a layout of the solenoid drive unit 10.

The NMOS 11 as a switching element, and the peripheral circuits including the control circuit 13, the conversion circuit 16, the amplifier circuit 17, and the smoothing circuit 18, are for example, as shown in FIG. 3, laid out in a semiconductor substrate 100.

Resistor elements $16_1$ to $16n$ that structure the conversion circuit 16 are connected parallel at the semiconductor substrate 100, and are arranged dispersed. The resistive circuits 21 to 23 that determine the gain of the amplifier circuit 17 are arranged between the dispersed resistor elements $16_1$ to $16n$.

In this way, by structuring the conversion circuit 16 with the plurality of resistor elements $16_1$ to $16n$, and arranging them dispersed, generation area of heat becomes wider. The resistive circuits 21 to 23 also receive effect of heat equally, by structuring each of the resistive circuits 21 to 23 with a plurality of resistor elements, and arranging them in between the resistor elements $16_1$ to $16n$ of the conversion circuit 16. In other words, the resistive circuits 21 to 23 and the conversion circuit 16 are closely combined thermally. When the conversion circuit 16 generates heat by a current that passes through the solenoid 15, the temperature of the resistive circuits 21 to 23 rise in accordance with the amount of generated heat thereof. Therefore, a highly accurate detection result is obtained without the need to install components and elements for temperature correction, to maintain the gain of the amplifier circuit 17 suitably.

To heighten the effects of above, it is preferable to arrange the resistor elements $16_1$ to $16n$ and the resistive circuits 21 to 23 closely.

Next, an operation of when the solenoid drive unit 10 in FIG. 1, drives the solenoid 15, and detects a current that passes through the solenoid 15, will be described.

FIGS. 4A to D are wave form charts for describing operations of the solenoid drive unit 10 in FIG. 1.

Figure 4:
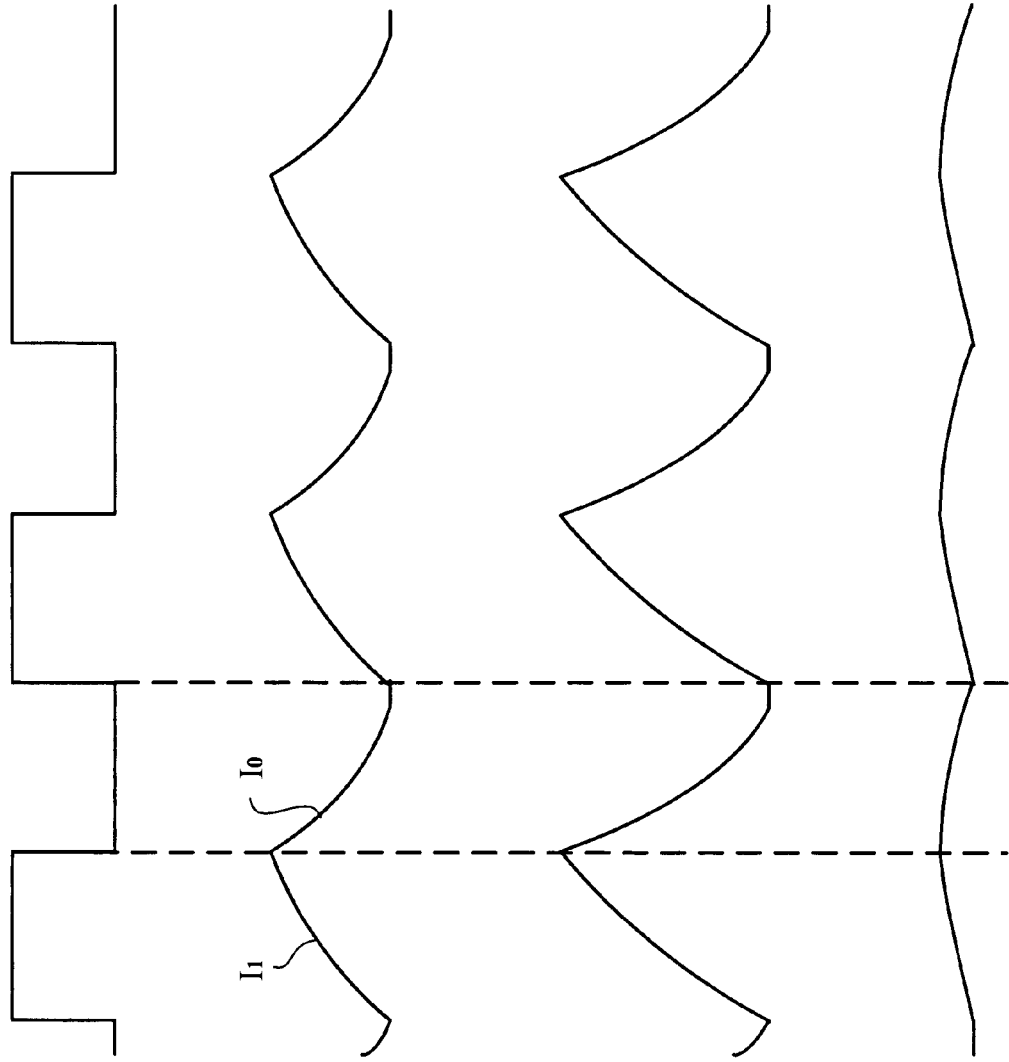
FIGS. 4A-4D are wave form diagrams for describing the operation of the solenoid drive unit in FIG. 1.

The control circuit 13 provides a control signal SC, whose level is repeated between a high level (hereinafter referred to as "H") and a low level (hereinafter referred to as "L"), as shown in FIG. 4A, to the gate of the NMOS 11, for driving the NMOS 11 to switch it on and off.

When the control signal SC is "H", the NMOS 11 is at an on state, and the NMOS 11 passes the power source current $I_1$, shown in FIG. 4B, to the solenoid 15 from the power source 12. The power source current $I_1$ that passed through the solenoid 15 passes through to the ground, being divided to the resistor elements $16_1$ to $16n$ in the conversion circuit 16.

When the control signal is "L", the NMOS 11 is at an off state, and the power source 12 and the solenoid 15 are disconnected. When the power source 12 and the solenoid 15 are disconnected, the voltage of the other end 15a of the solenoid 15, where one end 15b is connected to the ground, reduces by a counterelectromotive force, and forward voltage is applied to the diode 14. The diode 14, which is applied to the forward voltage, becomes a conducting state, and passes through the regenerative current $I_0$ shown in FIG. 4B, from the ground to the other end 15a of the solenoid 15. The current $I_0$ that passed through the solenoid 15 passes through the ground, being divided to the resistor elements $16_1$ to $16n$ in the conversion circuit 16. By this, the solenoid 15 is driven by the power source current $I_1$ and the regenerative current $I_0$.

At both ends of the conversion circuit 16, a voltage signal that corresponds to the currents $I_0$ and $I_1$, appears.

When applying an amplifier circuit that synthesized the amplifier circuit AA in FIG. 2A and the amplifier circuit AB in FIG. 2B, as the amplifier circuit 17, the amplifier circuit 17 amplifies the voltage signal corresponding to the currents $I_0$ and $I_1$ that the conversion circuit 16 generates, and outputs a voltage that pulsates, such as shown in FIG. 4C. The output voltage of the amplifier circuit 17 is output to the smoothing circuit 18, as the current detection signal. The gain of the current detection signal that the amplifier circuit 17 outputs, is set in the resistive circuits 21 to 23. The smoothing circuit 18 smoothes the output voltage of the amplifier circuit 17, such as shown in FIG. 4D.

The output of the smoothing circuit 18 is for example, A/D converted, and provided to processors for vehicle control, which is not shown in the drawings. The control circuit 13 controls the control signal, in accordance with the level of the signal that the smoothing circuit 18 outputs. For example, the control circuit 13 controls the frequency of the pulse of the control signal SC, or controls the pulse width, so that the signal level of the output signal of the smoothing circuit 18 becomes a desired level.

Here, as described above, the conversion circuit 16 is constituted by a plurality of resistor elements $16_1$ to $16n$, and are arranged dispersed. By this, the generation area of heat becomes a wide range. Also, by each of the resistive circuits 21 to 23 being constituted by a plurality of resistor elements $16_1$ to $16n$, and arranging them in between the resistor elements $16_1$ to $16n$, the effect of heat can be equally received. In other words, the resistive circuits 21 to 23 and the conversion circuit 16 are closely combined thermally. When the conversion circuit 16 generates heat by a current that passes through the solenoid 15, the temperature of the resistive circuits 21 to 23 rise in accordance with the amount of generated heat thereof. On the contrary, when the current that passes through the solenoid 15 decreases, and the temperature of the conversion circuit 16 falls, the temperature of the resistive circuits 21 to 23 also fall. Therefore, even if the value of resistance of the conversion circuit 16 changes in accordance with heat, the value of resistance of the resistive circuits 21 to 23, which set the gain of the current detection signal, also changes in the same way. Therefore, a highly accurate detection result is obtained without the need to install components and elements for temperature correction, to maintain the gain of the amplifier circuit 17 suitably.

As the above, the solenoid drive unit 10 of the present embodiment, has the advantages of below.

Because the NMOS 11, the control circuit 13, the conversion circuit 16, the amplifier circuit 17, and the smoothing circuit 18 are formed on the common semiconductor substrate 100, using a semiconductor device manufacturing process, the number of components can be reduced.

Because the NMOS 11, the control circuit 13, the conversion circuit 16, the amplifier circuit 17, and the smoothing circuit 18 are formed on the common semiconductor substrate 100, temperature distribution can be made uniform, and a highly accurate current detection is possible, without the need to install components for temperature correction.

By these advantages, low cost of the solenoid drive unit becomes possible.

Because the conversion circuit 16 is constituted by the plurality of resistor elements $16_1$ to $16n$, and further arranged dispersed, heat generating area spreads, and the temperature of the semiconductor substrate 100 can be made even more uniform.

Because each of the resistive circuits 21 to 23 is constituted by a plurality of resistor elements, and are placed in between the plurality of resistor elements $16_1$ to $16n$ in the conversion circuit 16, the thermal coupling of the resistive circuits 21 to 23 and the conversion circuit 16 improves, and accuracy of current detection can be highly maintained.

The present invention is not limited to the above embodiment, and various modification is possible. As an example of modification, there is an embodiment as below.

In the above embodiment, the resistive circuits 21 to 23 in the amplifier circuit 17 and the plurality of resistor elements $16_1$ to $16n$ are constituted by pure resistance. These resistor elements for example, diffuse impurities in the semiconductor substrate, and are constituted by a region of an arbitrary impurity concentration (electric conductivity). Or, an insulating film may be placed on the semiconductor substrate, and the resistor elements may be constituted by a semiconductor or a resistance layer formed on the insulating film. Furthermore, the resistor elements do not have to be constituted by pure resistance, and may be constituted by a MOS transistor which has a predetermined voltage applied to the gate thereof, or a bipolar transistor which has an arbitrary voltage applied to the base thereof. Namely, an arbitrary circuit element may be applied, as long as it functions as an equivalent resistance.

Figure 5:
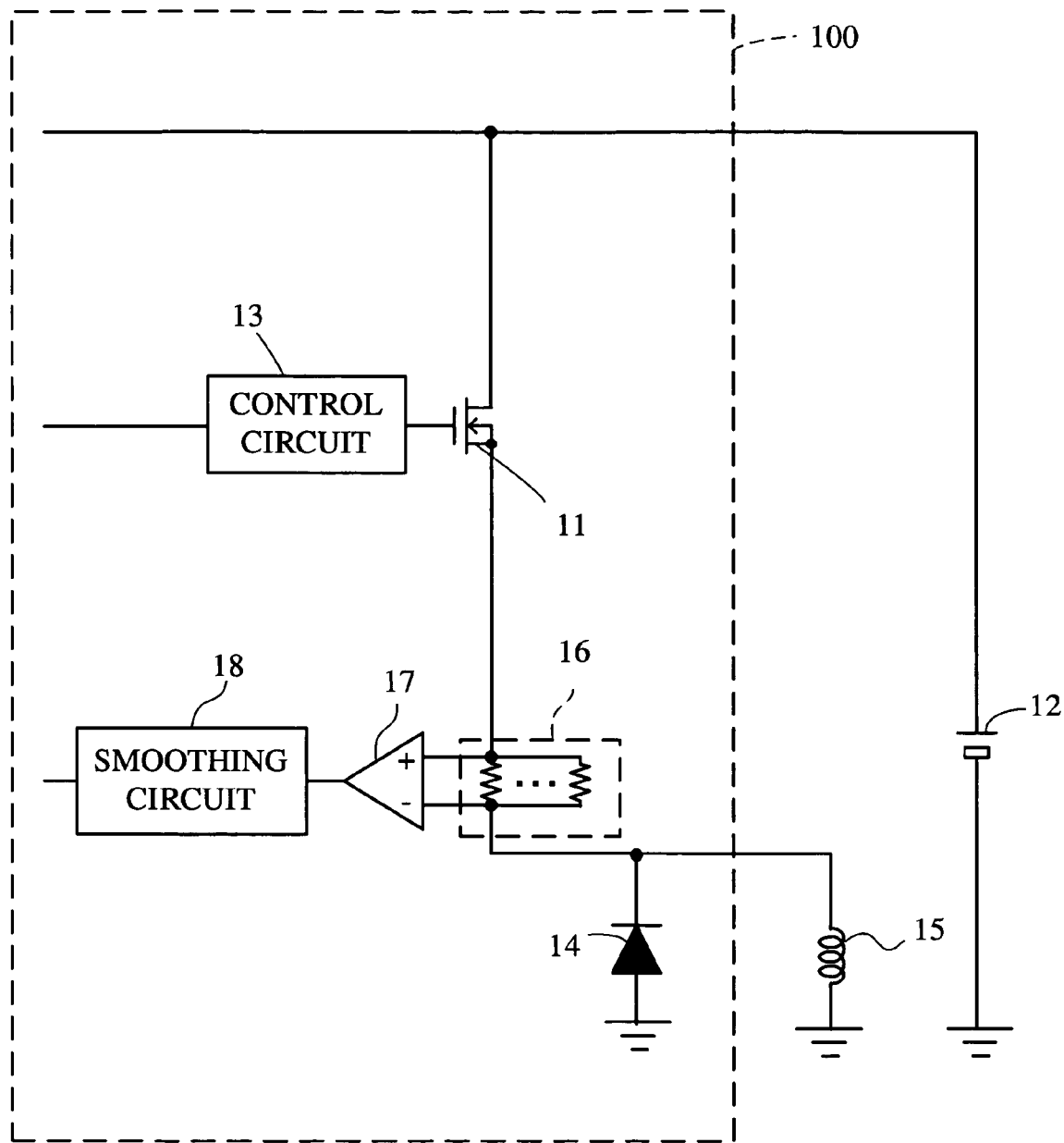
FIG. 5 is a diagram showing an example of modification (first modification example) of the solenoid drive unit.
Figure 6:
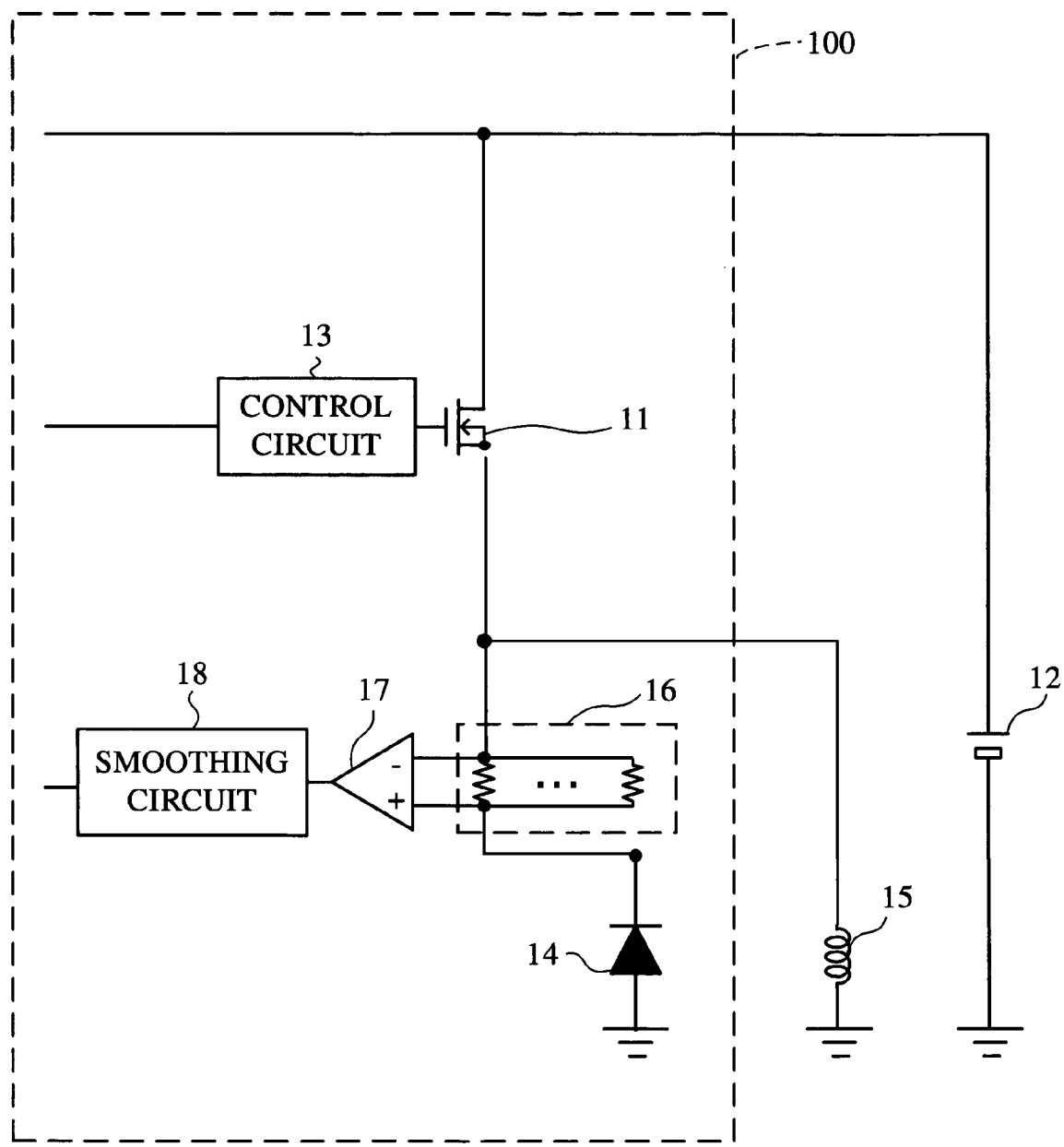
FIG. 6 is a diagram showing an example of modification (second modification example) of the solenoid drive unit.

FIGS. 5 and 6 are each diagrams showing an example of a modification of the solenoid drive unit 10.

Even if the NMOS 11, the diode 14, the conversion circuit 16, the amplifier circuit 17, and the smoothing circuit 18 are connected as FIGS. 5 and 6, the solenoid 15 can be current driven.

Figure 7:
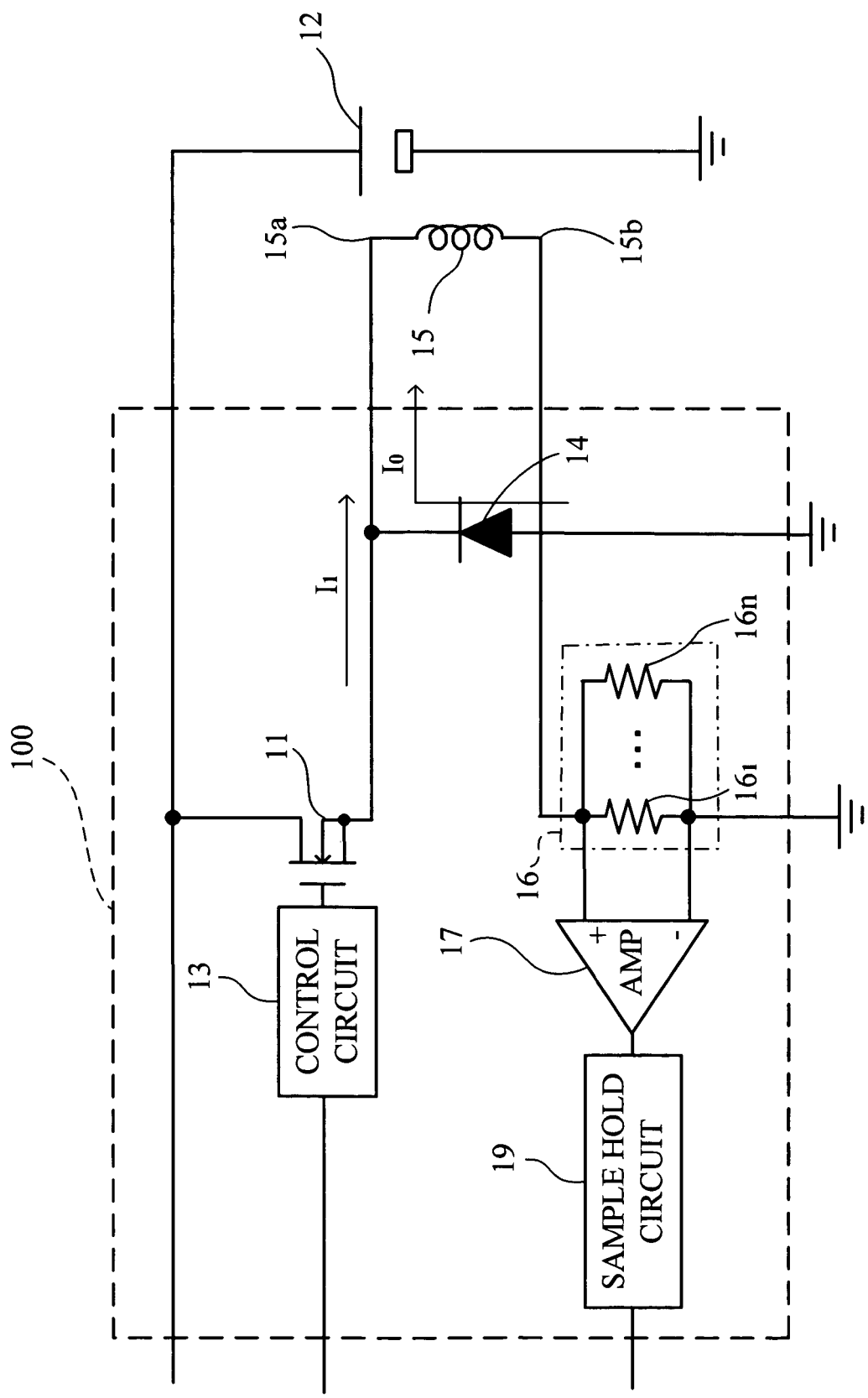
FIG. 7 is a diagram showing an example of modification (third modification example) of the solenoid drive unit.
Figure 8:
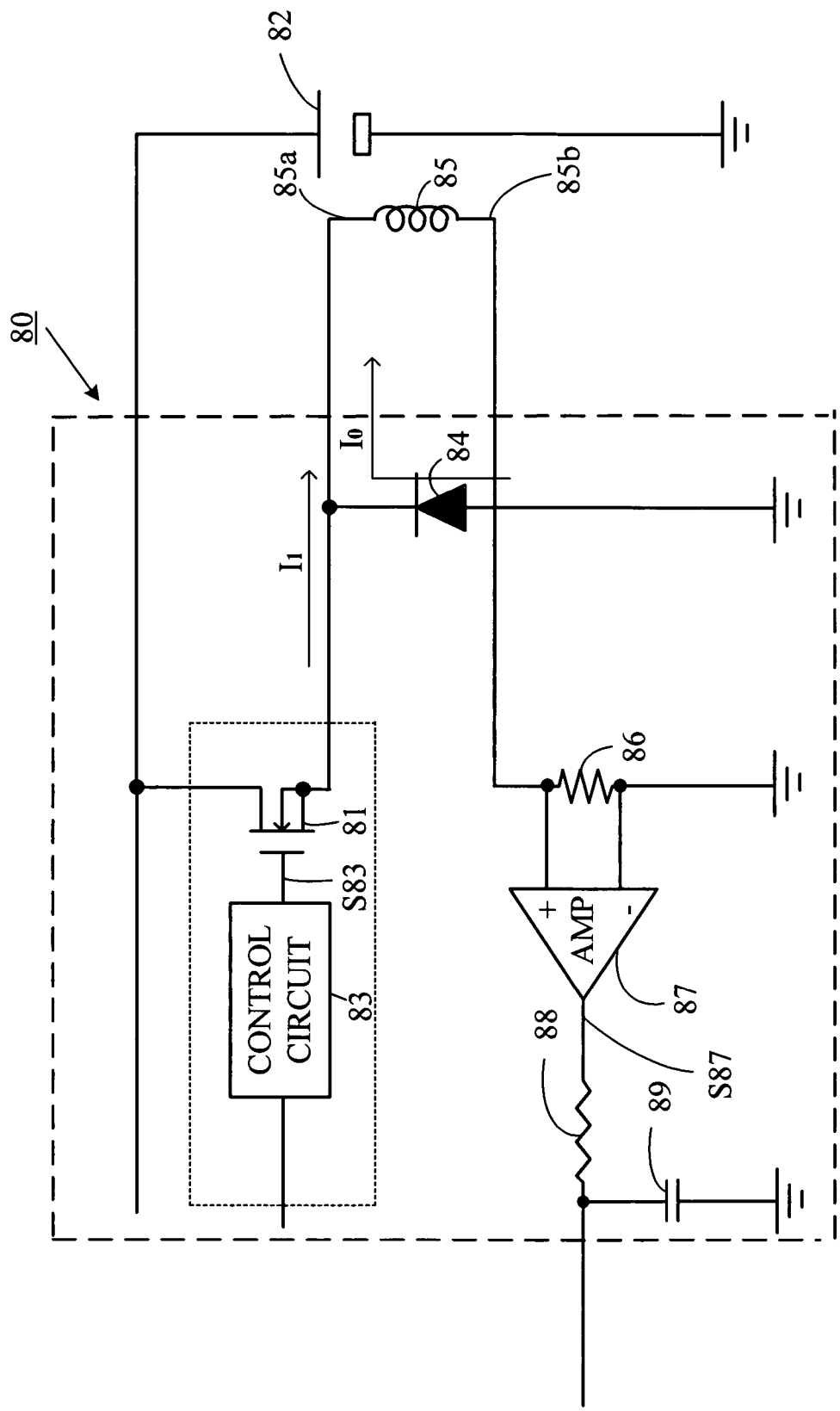
FIG. 8 is a diagram showing a conventional solenoid drive unit.

As shown in FIG. 7, the smoothing circuit 18 may be changed to a sample and hold circuit 19 that samples the output signal of the amplifier circuit 17 at a set timing, and retains the output signal.

In the above embodiment, the conversion circuit 16 is constituted by the parallel circuit of the plurality of resistor elements. However, the conversion circuit 16 may be constituted by a series circuit of a plurality of resistor elements. Each of the resistive circuits 21 to 23 for determining the gain, is constituted by the series circuit of the plurality of resistor elements. However, each of the resistive circuits 21 to 23 may be constituted by a parallel circuit of a plurality of resistor elements. In this case also, it is preferable that the resistor elements, which constitute the conversion circuit 16 are arranged dispersed, and that the resistor elements, which constitute the resistive circuits 21 to 23 are arranged dispersed, between thereof.

The arrangements of the conversion circuit 16 and the resistive circuits 21 to 23 are also arbitrary, as long as the heat generated by the conversion circuit 17 is transmitted to the resistive circuits 21 to 23, and the variation of the resistance of the resistor elements that constitute the conversion circuit 16 can follow the variation of the resistance of the resistive circuits 21 to 23. For example, the resistor elements that constitute the conversion circuit 16 may be arranged in a loop-shape, and the resistive circuits 21 to 23 may be placed in the loop. Or, the conversion circuit 16 may be placed in one place, and the resistive circuits 21 to 23 may be arranged closely around the vicinity thereof.

In the above embodiment, an example of applying the present invention to a detection circuit of a solenoid drive current is described. However, the present invention can be widely applied in a case of converting a current to a voltage using resistance, and amplifying the voltage. For example, a current subject to detection is not limited to a solenoid drive current, and the present invention can be applied for detection of an arbitrary drive current of an actuator, such as for example, a pulse motor, and a stepping motor, etc.

Various embodiments of the present invention described above are intended to illustrate the present invention, and are not for limiting the invention. Namely, various modifications made within the meaning of an equivalent of the claims of the invention and within the claims are to be regarded to be in the scope of the present invention.

This application is based on Japanese Patent Application No. 2001-368125 filed with the Japan Patent Office on Dec. 3, 2001, including specification, claims, drawings and summary. The disclosure of the above Japanese Patent Application is incorporated herein by reference in its entirety.

INDUSTRIAL APPLICABILITY

The present invention can be applied to an area of industry, which uses actuator drive circuits.

The invention claimed is:

1. A current detection circuit comprising:
   a conversion circuit (16) configured to allow a current to flow therethrough to a power load, and generate an electronic signal passing therethrough; corresponding to the current passing therethrough; and
   an amplifier circuit (17) configured to include a resistor circuit (21 to 23) for gain setting, the amplifier circuit amplifying an electric signal, generated by the conversion circuit, by the gain set by the resistor circuit and outputting the amplified electric signal as a current detection signal; wherein: said conversion circuit (16) and said amplifier circuit (17) are composed of elements of semiconductor material and formed commonly on a semiconductor substrate (100); said conversion circuit (16) and said resistor circuit (21 to 23) of said amplifier circuit are thermally coupled with each other to transfer a temperature change in said conversion circuit caused by a heat generated by a current flowing through said conversion circuit, so that a gain of said amplifier circuit (17) is changed in accordance with the temperature change of said conversion circuit (16) to thereby ensure high accuracy of the output current detection signal even in a case where the temperature change in said conversion circuit causes changes of the electric signal.

2. The current detection circuit according to claim 1, further comprising a switching element (11) formed on said common semiconductor substrate (100) and switches on and off the current flowing to said electric load, wherein said conversion circuit (16) and said resistor circuit (21 to 23) of said amplifier circuit (17) are thermally coupled with each other to transfer a temperature change in said conversion circuit caused by a heat generated by a current flowing through said switching element and said conversion circuit, so that a gain of said amplifier circuit (17) is changed in accordance with the temperature change of said conversion circuit (16) to thereby ensure high accuracy of the output current detection signal even in a case where the temperature change in said conversion circuit causes changes of the electric signal.

3. The current detection circuit according to claim 1, wherein said conversion circuit (16) comprises a plurality of conversion elements ($16_1$ to $16_n$) that convert a current flowing therethrough to a voltage to thereby generate said electric signal;

said resistor circuit (21 to 23) of said amplifier circuit (17) comprises a plurality of resistor elements (21 to 23); and said plurality of elements ($16_1$ to $16_n$) of said conversion circuit (16) and said plurality of resistor elements (21 to 23) of said resistor circuit (21 to 23) are formed in proximity to each other on said common semiconductor substrate (100).

4. The current detection circuit according to claim 1, wherein said conversion circuit (16) comprises a plurality of conversion elements ($16_1$ to $16_n$);

said resistor circuit (21 to 23) of said amplifier circuit (17) comprises a plurality of resistor elements (21 to 23), wherein the gain of said amplifier circuit (17) is changed in accordance with a temperature and in accordance with characteristics of said resistor circuit, and said plurality of elements ($16_1$ to $16_n$) of said conversion circuit (16) and said plurality of resistor elements (21 to 23) of said resistor circuit (21 to 23) are formed in proximity to each other on said common semiconductor substrate (100).

5. The current detection circuit according to claim 1, wherein said conversion circuit (16) comprises a plurality of conversion elements ($16_1$ to $16_n$);

said resistor circuit (21 to 23) of said amplifier circuit (17) comprises a plurality of resistor elements (21 to 23), wherein the gain of said amplifier circuit (17) is changed in accordance with a temperature and in accordance with characteristics of said resistor circuit;

at least a part of said plurality of resistor elements (21 to 23) of said amplifier circuit (17) is arranged in between the plurality of elements ($16_1$ to $16_n$) of said conversion circuit.

6. The current detection circuit according to claim 1, wherein said plurality of elements ($16_1$ to $16_n$) which constitutes said conversion circuit (16) and the elements which constitutes said amplifier circuit are resistor elements.

7. An actuator driver unit comprising a current detection circuit as recited in claim 1, further comprising:

a switching element (11) that makes and breaks a circuit between a power source (12) and said actuator (15), the actuator (15) to be a target of driving, a control circuit (13) that supplies the control signal to said switching element (11) in accordance with the output of said amplifier circuit (17), wherein said conversion circuit (16) generates said electric signal, which corresponds to a current passing through said actuator (15) by being electrically connected to and disconnected from said power source, by switching-on and -off of said switching element (11); and said amplifier circuit (17) amplifies the electronic signal output by said conversion circuit (16) and corresponding to the current passing through said actuator (15).

* * * * *